(12) United States Patent
Brunner et al.

(10) Patent No.: US 10,988,374 B2
(45) Date of Patent: Apr. 27, 2021

(54) DEVICE FOR SUPPORTING A MEMS COMPONENT

(71) Applicant: MEAS Switzerland S.a.r.l., Bevaix (CH)

(72) Inventors: Ismael Brunner, Bevaix (CH); Thomas Arnold, Montalchez (CH); Philippe Goguillot, Corcelles (CH)

(73) Assignee: MEAS SWITZERLAND S.à.r.l., Bevaix (CH)

(*) Notice: Subject to any disclaimer, the term of this patent is extended or adjusted under 35 U.S.C. 154(b) by 3 days.

(21) Appl. No.: 16/341,059

(22) PCT Filed: Oct. 12, 2017

(86) PCT No.: PCT/EP2017/076053
§ 371 (c)(1),
(2) Date: Apr. 10, 2019

(87) PCT Pub. No.: WO2018/069440
PCT Pub. Date: Apr. 19, 2018

(65) Prior Publication Data
US 2019/0248648 A1 Aug. 15, 2019

(30) Foreign Application Priority Data
Oct. 13, 2016 (EP) .................................... 16002203

(51) Int. Cl.
*B81B 7/00* (2006.01)
*H01L 23/00* (2006.01)

(52) U.S. Cl.
CPC ............ *B81B 7/0074* (2013.01); *H01L 24/97* (2013.01); *B81B 2201/0264* (2013.01); *B81C 2203/032* (2013.01)

(58) Field of Classification Search
CPC .......... B81B 7/0074; B81B 2201/0264; H01L 24/97; H01L 23/498; H01L 21/50; B81C 2203/032
USPC ....................... 257/417, 414, 415; 438/50–53
See application file for complete search history.

(56) References Cited

U.S. PATENT DOCUMENTS

| 6,384,473 B1 | 5/2002 | Peterson et al. |
| 6,630,725 B1 | 10/2003 | Kuo et al. |
| 2011/0036174 A1* | 2/2011 | Hooper et al. ........ B81B 7/0061 73/721 |
| 2014/0103518 A1 | 4/2014 | Fu et al. |

FOREIGN PATENT DOCUMENTS

EP 2871152 A1 5/2015

OTHER PUBLICATIONS

International Search Report dated Jan. 2, 2018 for corresponding International Application No. PCT/EP2017/076053 filed Oct. 12, 2017; total 3 pages.

(Continued)

*Primary Examiner* — Thinh T Nguyen

(57) ABSTRACT

The invention relates to a device for supporting a MEMS component, especially a pressure sensor, having a substrate formed of a ceramic, a MEMS component on the substrate and walls forming a cavity for surrounding the MEMS component, in which the walls are formed from a machined ceramic cavity array.

18 Claims, 1 Drawing Sheet

(56) References Cited

OTHER PUBLICATIONS

Written Opinion of the International Searching Authority dated Jan. 2, 2018 for corresponding International Application No. PCT/EP2017/076053 filed Oct. 12, 2017; total 6 pages.
European Communication, European Application No. 16002203.4-1230, European Filing dated Jun. 17, 2020.

* cited by examiner

DEVICE FOR SUPPORTING A MEMS COMPONENT

CROSS-REFERENCE TO RELATED PATENT APPLICATION

This patent application is a U.S. National Stage entry under 35 U.S.C. § 371 of International Application No. PCT/EP2017/076053 filed Oct. 12, 2017, which claims priority to European Patent Application No. 16002203.4 filed on Oct. 13, 2016, which applications are hereby incorporated by reference in their entirety.

FIELD

The invention relates to a device for supporting a MEMS component, an array of the device, a system comprising the device, a method for manufacturing the device supporting a MEMS component and a use of walls for surrounding a MEMS component.

The invention relates to a device for supporting a MEMS component, an array of the device, a system comprising the device, a method for manufacturing the device supporting a MEMS component and a use of walls for surrounding a MEMS component.

BACKGROUND

It is known to form a so-called MEMS (micro electro-mechanical system) package (i.e. a packaged electronic module) which comprises a MEMS component which is at least partially surrounded by walls and/or a lid. A device is known which comprises the MEMS component which is supported on a substrate. Most often the substrate is formed of a ceramic or a printed circuit board (PCB). The walls and/or the lid of the known device are formed of plastic, metal or ceramic. However, it has been found that the dimensions, especially the footprint of the device, are difficult to be decreased, especially due to assembly and manufacturing tolerances.

It is known to form a so-called MEMS (micro electro-mechanical system) package (i.e. a packaged electronic module) which comprises a MEMS component which is at least partially surrounded by walls and/or a lid. A device is known which comprises the MEMS component which is supported on a substrate. Most often the substrate is formed of a ceramic or a printed circuit board (PCB). The walls and/or the lid of the known device are formed of plastic, metal or ceramic. However, it has been found that the dimensions, especially the footprint of the device, are difficult to be decreased, especially due to assembly and manufacturing tolerances

SUMMARY

It is an object of the present invention to provide a device for supporting a MEMS component providing the possibility of reducing the footprint of the device. A further object of the present invention is to provide an efficient manufacturable device and a method for manufacturing the same.

It is an object of the present invention to provide a device for supporting a MEMS component providing the possibility of reducing the footprint of the device. A further object of the present invention is to provide an efficient manufacturable device and a method for manufacturing the same.

This object is achieved by the subject-matters of the independent patent claims. Further embodiments are shown in the dependent claims as well as the following description.

The gist of the invention is to use a material for the walls that is similar to the material which is used for the substrate, i.e. a ceramic. The inventors were the first who recognized that when using a ceramic for the substrate, a ceramic cavity array for the walls and/or the lid, thinner walls and/or a thinner lid can be obtained. A ceramic cavity array can be manufactured with high accuracy and addition it can be handled and further processed in a simple manner. When using a ceramic cavity array, the thickness of the walls can be decreased. During manufacturing of the array of the devices a thickness for a wall can be used which is at least two times of the thickness of wall of a single device. When separating the devices each of the walls is used for the two adjacent devices such that the wall thickness is less than the thickness of a wall separating the devices in the array. Further, the walls and/or the lid have a similar coefficient of thermal expansion (CTE) with regard to the substrate.

BRIEF DESCRIPTION OF THE DRAWINGS

In the following, the invention will be described in more detail with reference to an embodiment illustrated in the drawings, in which.

DETAILED DESCRIPTION

Figure 1:
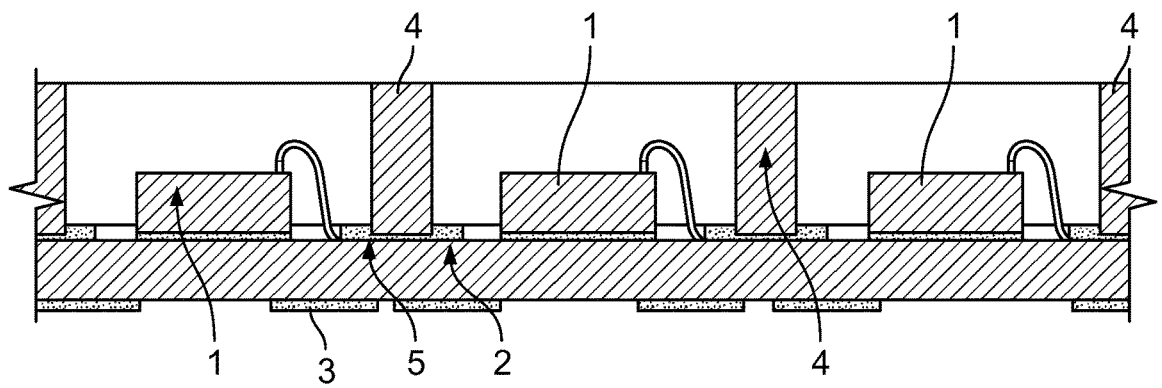
FIG. 1—is a sectional side view of an array of devices according to the invention.

According to an embodiment of the invention, a device for supporting a MEMS component is provided. The MEMS component is especially a pressure sensor. The device has a substrate formed of a ceramic, a MEMS component supported on the substrate, and walls forming a cavity for surrounding the MEMS component. The walls are formed of a machined ceramic cavity array. Especially, the walls can be formed of a similar ceramic or the same ceramic as the substrate. The walls could be formed from all kind of ceramic or other rigid material. In a preferred embodiment the two materials have the same or similar coefficient of thermal expansion (CTE) to avoid stress in assembly (preferably less than 10% difference).

The term "machined" according to the invention encompasses a treatment of at least one wall in which the wall of one of the devices is separated from a wall of a further device. The term "machined" especially encompasses a treatment of cutting, dicing or separating of two of the devices along a wall of one of the devices.

The walls can be manufactured as a single piece for an array of devices. Thus, four walls surrounding the MEMS component can be unitarily formed, e.g. by laser drilling a ceramic plate-like element in the cavity array. The plate-like element forming the array of cavities can have the same dimension as the substrate forming an array of MEMS components. A simple manufacture process can be obtained.

The term "supporting" encompasses the formation of a package comprising the MEMS component, wherein the package comprises the substrate, the MEMS component, a contact structure for contacting the MEMS component and a surrounding structure which is mounted on the substrate for at least partially surrounding and/or covering the MEMS component. The walls surrounding the MEMS component can form a cavity for the MEMS component. The walls may have at least one opening so that the at least one opening can lead in or out of the cavity.

The term "array" according to the invention encompasses a structural element, for example a cavity or a component, which is repeatedly arranged in rows and lines, wherein the number of the structural element in a row and/or a line is at least two.

The term "similar" according to the invention encompasses the meaning that the materials for the walls and the substrate with regard to the CTE are similar, for example for the CTE to differ by less than 10%. Further, the term "similar" encompasses the meaning that the same material is used for the walls as well as for the substrate.

The device can further comprise an ASIC (application specific integrated circuit) which can be functionally connected to the MEMS component.

According to one exemplary embodiment, the walls are connected to the substrate by adhesive bonding. This manner of connection is easy and can be easily implemented in the manufacturing process. The glue can be screen printed on the cavity array, which is then aligned and bonded to the substrate that supports the MEMS components. In a preferred embodiment, epoxy or silicone glue can be used. Preferably, the hole assembly is cured by applying heat in an oven.

According to one exemplary embodiment, the device has a lid formed from a ceramic for at least partially covering the MEMS component. The lid can comprise openings and/or through-holes which lead in or out of the cavity comprising the MEMS component.

The device can have a footprint of around 1.5 mm×1.5 mm, especially preferred around 1.3 mm×1.4 mm.

According to one exemplary embodiment, the lid is connected to the walls by adhesive bonding so that the walls as well as the lid can be mounted on the substrate and the walls, respectively, by using a manufacture process which is well known and simply manageable.

According to one exemplary embodiment, the walls have a thickness of less than 0.2 mm, preferably 0.15 mm. In a preferred exemplary embodiment the walls have a thickness of 0.1 mm.

According to one aspect of the invention, the invention provides an array of the above-mentioned devices, wherein the device is repeatedly arranged in rows and lines. Such an array can be easily manufactured using processes or process steps which are compatible to those used in microfabrication processes. The cavity array can be laser drilled into a ceramic plate-element.

In one exemplary embodiment an array of devices is provided, wherein the lid is of substantially the same dimension with regard to the area as the substrate so that the lid does not have to be adapted or matched to one specific device but can be cut into the dimensions for covering the whole array. The term "substantially the same" encompasses according to the invention deviations with regard to tolerance due to the manufacture process, however, a deviation of up to and including +/−10% is covered by the term "substantially the same".

According to a further embodiment of the present invention, a system is provided which comprises the device and a MEMS component, especially a pressure sensor, wherein at least one electrical contact structure is provided to connect the MEMS component. The contact structure can be preferably shaped as a contact pad on the outside of the device, especially the substrate of the device. The contact structure can be connected to the ASIC and/or MEMS component by wire bonding.

According to a further embodiment of the present invention, a method for manufacturing a device for supporting a MEMS component is provided. The MEMS component can be especially a pressure sensor. The method comprises the step of mounting the MEMS component on a ceramic substrate and the method further comprises the step of providing walls formed of a ceramic surrounding a cavity for the MEMS component, the walls being part of a cavity array.

According to an exemplary embodiment, the walls are bonded to the substrate by an adhesive.

According to an exemplary embodiment, the device is cut out of the array.

According to a further embodiment of the invention, a use of walls for surrounding a MEMS component is provided. The MEMS component can be especially a pressure sensor. The MEMS component is supported on a substrate. The substrate is formed of a ceramic. A ceramic is used for the walls.

The above description, like the following description of exemplary embodiments is not to be construed as relinquishing specific embodiments of features.

FIG. 1 shows a sectional side view of devices according to the invention. The devices are formed in an array with rows and lines. The device comprises a MEMS component 1 mounted on a substrate 2. The MEMS component 1 is wire bonded to two contact structures 3 formed as connection pads. The wiring bonding is an example, the bonding can be of any other known connection type. The MEMS component 1 is surrounded by walls 4. The walls 4 and the substrate 2 are made of a ceramic.

FIG. 1 shows how the devices are manufactured in an array and the walls 4 form a matrix cavity in the shape of a grid having the same spatial dimensions with regard to the surface as the substrate 2. The walls 4 are formed from a cavity array. The walls 4 are adhesively bonded to substrate 2 using an adhesive 5.

To obtain the single device from the array of devices shown in FIG. 1, the devices can be cut into single devices. Each of the walls 4 shown in FIG. 1 contributes substantially half of the thickness to one of the devices.

Figure 2:
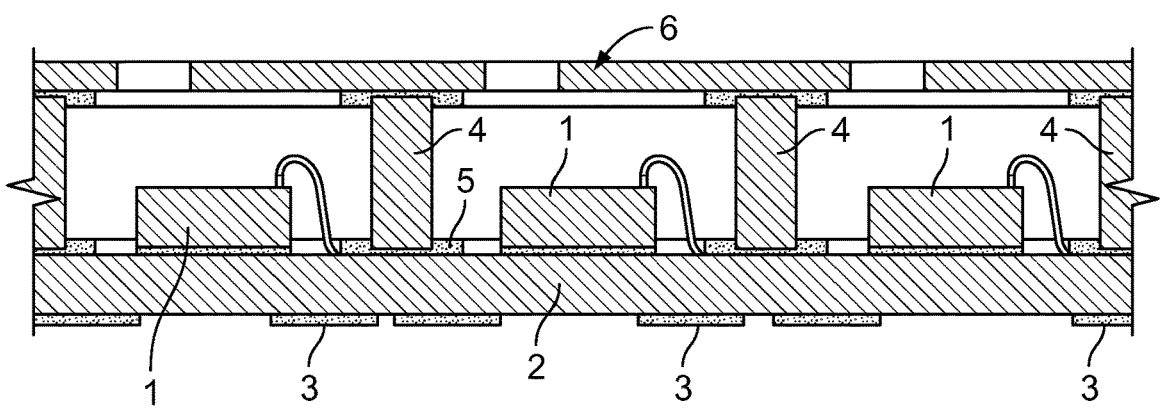
FIG. 2—is a sectional side view of a further embodiment of the array of devices shown in FIG. 1.

A further embodiment is shown in FIG. 2, where a lid 6 is adhesively bonded to the walls 4. The lid 6 is formed of the ceramic used for the walls 4 and the substrate 2. The lid 6 has the same dimensions with regard to the area of the surface as the matrix cavity grid of the walls 4 and the substrate 2.

Figure 3:
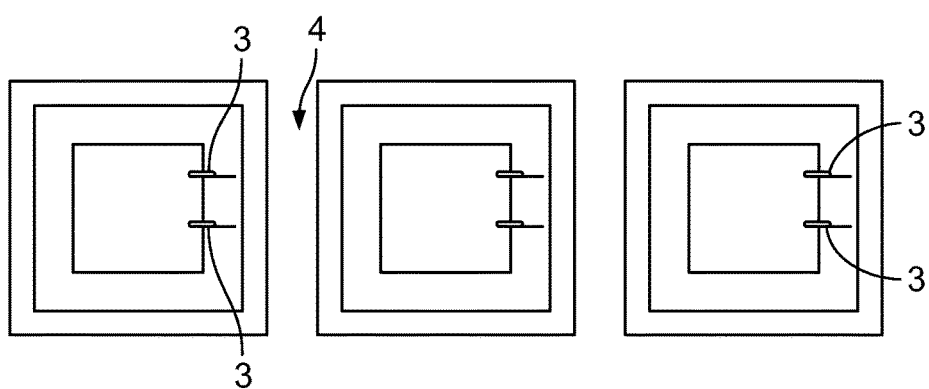
FIG. 3—is a top view of the array of FIG. 1 seen from top.

FIG. 3 shows a top view of the array of FIG. 1 or 2 seen from top.

| List of reference numbers |
| --- |
| 1. MEMS component |
| 2. substrate |
| 3. contact structures |
| 4. walls |
| 5. adhesive |
| 6. lid |
| 7. |
| 8. |
| 9. |
| 10. |
| 11. |
| 12. |
| 13. |

| List of reference numbers |
|---|
| 14. |
| 15. |
| 16. |
| 17. |
| 18. |
| 19. |
| 20. |
| 21. |
| 22. |
| 23. |
| 24. |
| 25. |
| 26. |
| 27. |
| 28. |
| 29. |
| 30. |
| 31. |
| 32. |
| 33. |
| 34. |
| 35. |
| 36. |
| 37. |
| 38. |
| 39. |
| 40. |
| 41. |
| 42. |
| 43. |
| 44. |
| 45. |
| 46. |
| 47. |
| 48. |
| 49. |
| 50. |
| 51. |
| 52. |
| 53. |
| 54. |
| 55. |
| 56. |
| 57. |
| 58. |
| 59. |
| 60. |
| 61. |
| 62. |
| 63. |
| 64. |
| 65. |
| 66. |
| 67. |
| 68. |
| 69. |
| 70. |
| 71. |
| 72. |
| 73. |
| 74. |
| 75. |
| 76. |
| 77. |
| 78. |
| 79. |
| 80. |
| 81. |
| 82. |
| 83. |
| 84. |
| 85. |
| 86. |
| 87. |
| 88. |
| 89. |
| 90. |
| 91. |
| 92. |
| 93. |
| 94. |
| 95. |
| 96. |

The invention claimed is:

1. An array of two or more devices for supporting two or more MEMS components, the array comprising:
a substrate that is common to the two or more devices and that is formed of a ceramic material;
two or more MEMS components on the substrate; and
a number of walls on the substrate forming two or more adjacent cavities for surrounding each of the two or more MEMS components, wherein the walls are part of an integral one-piece wall structure formed from a machined ceramic cavity array, wherein the walls are solid and adjacent cavities share a common wall, and wherein each common wall contributes substantially half of its thickness to each adjacent cavity and the MEMS component in each adjacent cavity making up adjacent devices.

2. The array of claim 1, wherein the walls are connected to the substrate by adhesive bonding.

3. The array of claim 1 further comprising a lid formed from a machined stacked ceramic array.

4. The array of claim 3, wherein the lid is connected to the walls by adhesive bonding and cover the two or more adjacent cavities.

5. The array of claim 1, wherein the walls have a thickness smaller than about 0.2 mm.

6. The array of claim 1, wherein one of the two or more MEMS components is a pressure sensor.

7. The array of claim 1, wherein each device in the array is repeatedly arranged in rows and lines, wherein the number of devices in a row and/or a line is at least 2.

8. The array of claim 4, wherein the lid is of substantially the same dimension with regard to the area as the substrate.

9. A system comprising the array of claim 1, and wherein a contact structure is provided to connect the two or more MEMS components on the outside of the respective two or more devices.

10. The system of claim 9 wherein one of the two or more MEMS components is a pressure sensor.

11. The array of claim 1, wherein the substrate and the walls have coefficients of thermal expansion that are within about 10 percent or less of one another.

12. An array of devices for supporting a number of MEMS components, the array of devices comprising:
a substrate formed of a ceramic material and common to the array of devices;
a two or more MEMS components disposed on the substrate and equal to the number of devices in the array of devices; and
a wall structure connected with the substrate and forming an array of cavities, wherein each cavity in the array of cavities surrounds one of the MEMS components, wherein each cavity in the array of cavities comprises four walls that are an integral one-piece construction of the wall structure such that each adjacent cavities shares a common solid wall, wherein each common wall contributes substantially half of its thickness to each of the adjacent cavities and respective adjacent devices, and wherein substrate and the wall structure have coefficients of thermal expansion that are within about 10 percent or less of one another.

13. The array of devices of claim 12, comprising a lid disposed over the wall structure and covering the array of cavities, wherein the lid is formed from a ceramic material and has an outside dimension that is the same as the substrate.

14. The array of devices of claim 13, wherein the substrate, wall structure, and lid are formed from the same type of ceramic material.

15. The array of the devices of claim 12, wherein the common wall between the adjacent cavities is configured to provide two devices each comprising a single cavity by cutting the common wall resulting in a device wall having a thickness that is half of the common wall thickness.

16. An array of two or more devices for supporting two or more MEMS components, the array of two or more devices comprising:
  a substrate formed of a ceramic material and common to each of the two or more devices;
  the two or more MEMS components each disposed on the substrate, wherein the MEMS components are electrically connected with a contact structure disposed on an outside surface of the substrate; and
  a wall structure that is an integral one-piece construction formed of a ceramic material adhesively attached with the substrate, the wall structure comprising an array of cavities wherein each cavity surrounds one of the MEMS components, wherein each cavity of the wall structure comprises four walls and each adjacent cavity shares a common wall that is solid and that contributes substantially half of its thickness to each adjacent cavity, wherein the wall structure has an outside dimension that is the same as the substrate.

17. The array of two or more devices of claim 16, wherein the substrate and the wall structure have coefficients of thermal expansion that are within about 10 percent or less of one another.

18. The array of two or more devices of claim 16 comprising a lid connected with the wall structure and extending over the array of cavities, the lid formed from a ceramic material and having an outside dimension that is substantially the same as the substrate.

* * * * *